(12) United States Patent
Lee et al.

(10) Patent No.: US 7,527,901 B2
(45) Date of Patent: May 5, 2009

(54) METHOD OF REPAIRING PHASE SHIFT MASK

(75) Inventors: Jeong-Yun Lee, Yongin-si (KR); Seong-Woon Choi, Suwon-si (KR); Il-Yong Jang, Yongin-si (KR); Won-Suk Ahn, Yongin-si (KR); Sung-Jae Han, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 581 days.

(21) Appl. No.: 11/177,434

(22) Filed: Jul. 11, 2005

(65) Prior Publication Data

US 2006/0019178 A1    Jan. 26, 2006

(30) Foreign Application Priority Data

Jul. 22, 2004    (KR) .................... 10-2004-0057331

(51) Int. Cl.
*G03F 1/00*    (2006.01)

(52) U.S. Cl. ......................................... 430/5

(58) Field of Classification Search .............. 430/5, 430/394; 204/192.1, 192.2
See application file for complete search history.

(56) References Cited

U.S. PATENT DOCUMENTS

| | | | |
|---|---|---|---|
| 4,661,426 A | | 4/1987 | Matsuda et al. |
| 4,717,625 A | | 1/1988 | Watakabe et al. |
| 5,460,908 A | * | 10/1995 | Reinberg ........................ 430/5 |
| 2004/0072081 A1 | * | 4/2004 | Coleman et al. ............... 430/5 |
| 2005/0208393 A1 | * | 9/2005 | Dieu et al. ...................... 430/5 |
| 2006/0134534 A1 | * | 6/2006 | Dieu et al. ...................... 430/5 |

FOREIGN PATENT DOCUMENTS

| | | |
|---|---|---|
| JP | 10-003162 | 1/1998 |
| KR | 1999-0070107 | 9/1999 |
| KR | 10-1999-0033538 | 12/1999 |
| KR | 10-1999-0088538 | 12/1999 |
| KR | 10-2004-0008599 | 1/2004 |

\* cited by examiner

*Primary Examiner*—Stephen Rosasco
(74) *Attorney, Agent, or Firm*—Volentine & Whitt, PLLC

(57) ABSTRACT

A method of repairing a phase shift mask includes exposing upper and side surfaces of the phase shift pattern of the mask, selectively forming a passivation layer on the surfaces of the exposed phase shift patterns, and then cleaning the phase shift mask on which the passivation layers are formed. The repairing of the phase shift mask is carried out in the midst of a series of photolithographic exposure processes in which the phase shift mask is used to transfer an image to a photoresist layer or layers. After the photomask is cleaned, a determination is made as to whether the transmittance of the phase shift pattern is above a threshold value.

18 Claims, 4 Drawing Sheets

Number of cleaning processes

METHOD OF REPAIRING PHASE SHIFT MASK

BACKGROUND OF THE INVENTION

1. Field of the Invention

The present invention relates to a photomask used in photolithography to transfer an image to a photoresist layer on a substrate such as a semiconductor wafer. In particular, the present invention relates to a phase shift mask and to a method of repairing a phase shift mask.

2. Description of the Related Art

A photomask is an optical element through which a photoresist film, formed on a semiconductor substrate, is exposed to light of a given wavelength (referred to hereinafter as "exposure light"). A typical photomask, known as a binary mask, has a light-shielding pattern formed on a transparent quartz substrate. The light-shielding pattern is made of chromium so as to block light. Thus, the exposure light that is not incident on the light-shielding pattern is transmitted through the photomask to expose respective areas of the photoresist film and thereby transfer an image corresponding to the light-shielding pattern onto the film. The photoresist film is subsequently subjected to a developing process which removes either the exposed or non-exposed portion of the film and thereby forms a photoresist pattern.

Nowadays, the manufacturing of highly integrated semiconductor devices requires the forming of very fine patterns on the substrates. However, the fineness of the pattern that can be attained using a binary mask is limited due to certain optical effects associated with the mask. Accordingly, a phase shift mask capable of forming a finer photoresist pattern than a binary mask is currently in wide use in the semiconductor manufacturing industry.

A phase shift mask has a phase shift pattern constituted by a material, e.g., molybdenum suicide, that transmits a portion of the exposure light, as opposed to material such as chromium that blocks all of the incident exposure light. Such a phase shift mask is disclosed in detail in U.S. Pat. No. 5,286,581.

As is well known by those skilled in the art, forming a fine photoresist pattern using a phase shift mask requires a light source that emits exposure light of a relatively short wavelength. Currently, a KrF laser that emits ultraviolet light having a wavelength of 248 nm or an ArF laser that emits light having a wavelength of 193 nm has been used as the light source. Furthermore, the energy of light is inversely proportional to its wavelength. Accordingly, when the photomask is irradiated by light of a short wavelength, the high energy level of the light causes impurities in the photomask to cohere. The impurities include sulfur (S), carbon (C), and ammonia ($NH_3$), those created as by-products of the process of manufacturing the photomask, and nitrogen ($N_2$) and water vapor ($H_2O$) which are introduced from the ambient of the room in which the photolithography process is being carried out.

The cohered impurities block a portion of the light during the exposure process. Consequently, the photoresist film may be patterned undesirably at areas corresponding to the locations of the cohered impurities. Thus, the photomask should be cleaned to remove any lumps of cohered impurities. The cleaning process is usually performed by the manufacturer of the photomask not by the end user, i.e., the semiconductor chip manufacturer.

However, a phase shift pattern of, for example, molybdenum silicide, is etched by an etchant used in the cleaning process, as shown in FIG. 1. More specifically, with reference to FIG. 1, a typical phase shift mask includes a photomask substrate 10 that is divided into a main region b and a peripheral region a, and a phase shift pattern 11b exposing portions of the photomask substrate 10 within the main region b. Most of the peripheral region a is covered by a phase shift film 11a and a light-shielding film 12. The phase shift pattern 11b within the main region b is produced by etching the phase shift film 11a. At this time, the thickness of the phase shift pattern 11b is substantially identical to the thickness $t_o$ of the phase shift film 11a.

However, as mentioned above, the phase shift pattern 11b is etched during the cleaning process. As a result, the thickness of the phase shift pattern is reduced to t during the cleaning process ($t<t_o$). Furthermore, the thickness t of the phase shift pattern 11b is a technical factor that determines the light transmittance T of the phase shift pattern. The light transmittance T of the phase shift pattern is, in turn, a characteristic of the mask that affects the process conditions and process margin of the wafer exposure process. Still further, the cleaning process may be repeated throughout the course of manufacture of the phase shift mask. As a result, the thickness of the phase shift pattern 11b is further reduced.

FIG. 2 is a graph of the results of an experiment in which a phase shift mask was cleaned several times. Originally, the phase shift pattern had a light transmittance of about 8%. Then, the phase shift mask was cleaned several times. Accordingly, the light transmittance of the phase shift pattern 11b increased linearly with the number of cleanings, as shown in the graph. The light transmittance of the photomask exceeded the limit transmittance Tc of 9% after the phase shift mask was cleaned 8 times. The limit transmittance Tc is a threshold value at which the photomask is no longer useful for a particular wafer exposure process.

SUMMARY OF THE INVENTION

An object of the present invention is to provide a method of repairing a photomask capable of extending the useful life of the photomask.

Another object of the present invention is to provide a method of photolithography in which the photomask can be cleaned without damaging the phase shift pattern of the mask.

According to one aspect of the present invention, the phase shift pattern is metallic, and a method of repairing the phase shift mask includes selectively forming passivation layers on exposed surfaces of the phase shift pattern, and subsequently cleaning the phase shift mask. In this respect, the present invention is well-suited for repairing a phase shift mask whose phase shift pattern comprises at least one material selected from the group consisting of molybdenum, tantalum, zirconium, chromium, and tungsten, and a silicide of such metals. Preferably, the phase shift pattern is formed of molybdenum or molybdenum silicide. Furthermore, the passivation layers are preferably formed so as to have a thickness within a range of 3 to 100 Å.

The passivation of the phase shift pattern can be carried out by treating the phase shift pattern with plasma. First, the phase shift mask is loaded into a plasma process chamber. Then, process gas is injected into the plasma process chamber. The injected process gas is converted into plasma. Finally, the exposed surfaces of the phase shift pattern are treated in the process chamber with the plasma. The process gas contains atoms of at least one gas selected from the group consisting of oxygen, ozone, and nitrogen.

Preferably, 200 to 600 Watts of power is delivered to the plasma process chamber to excite the process gas therein and thereby convert the process gas to plasma. Also, a bias power of 1 to 30 Watts may be applied to an electrode within the plasma process chamber to accelerate the plasma towards the photomask. Still further, a temperature within a range of 10 to 100° C. is preferably maintained in the plasma process chamber during the passivation process.

According to another aspect of the present invention, the process of repairing the photomask is carried out as part of an overall photolithographic process or series of photolithographic processes. First, an exposure process is performed in which a layer of photoresist is irradiated with exposure light of a given wavelength directed through the phase shift mask. Subsequently, the photomask is cleaned. The cleaning may be carried out by rinsing the photomask with a solution of chemicals that will remove any particles that were cohered by the exposure light. Prior to the cleaning process, though, the exposed surfaces of the phase shift pattern are passivated to protect them against the chemicals used in the cleaning process. Accordingly, the photomask can be used over and over again to carry out additional exposure processes.

BRIEF DESCRIPTION OF THE DRAWINGS

These and other objects, features and advantages of the present invention will be better understood from the detailed description thereof that follows as made with reference to the accompanying drawings, of which.

DETAILED DESCRIPTION OF PREFERRED EMBODIMENTS

Figure 3:
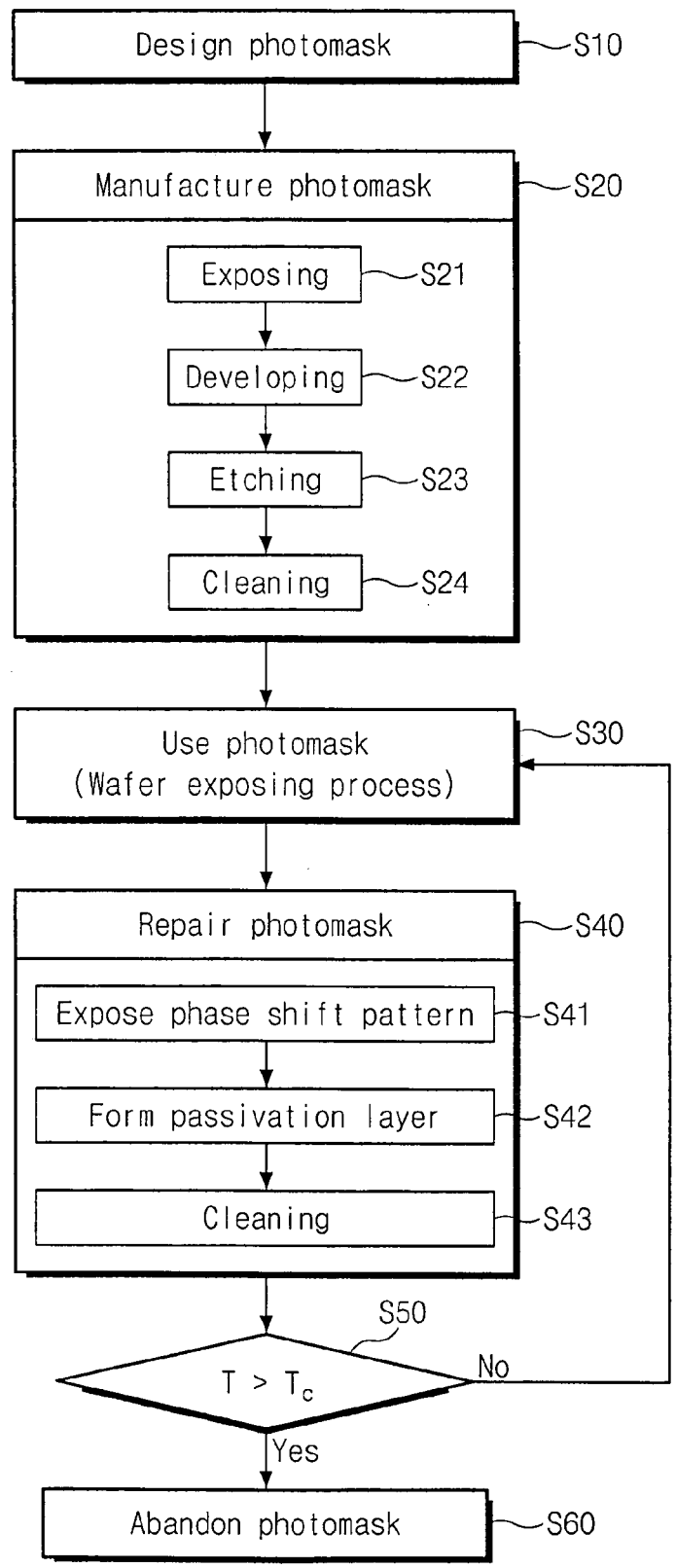
FIG. 3 is a flow chart of a method of repairing a photomask according to the present invention.

Referring to FIG. 3, a circuit pattern of a semiconductor device is designed using computer programs such as CAD and OPUS programs (step S10). The designed circuit pattern is stored in a memory device as (electronic) design data. Next, a photomask is manufactured using the design data (S20). The manufacturing of the photomask includes an exposure process (step S21), a developing process (step S22), an etching process (step S23), and a cleaning process (step S24). The exposure process (step S21) entails irradiating a predetermined region of a photoresist film with an electron beam. The photoresist film is formed over a phase shift film on a photomask substrate. The region of the photoresist film irradiated with the electron beam is determined based on the design data. The developing process (step S22) removes the exposed (or non-exposed) portion of the photoresist film to thereby pattern the photoresist film and expose portions of the phase shift film. The etching process (step S23) entails etching the phase shift film using the photoresist pattern as an etch mask. As a result, a phase shift pattern exposing the photomask substrate is formed. Subsequently, the photoresist pattern is removed. The cleaning process (step S24) removes by-products or particles produced during the aforementioned photomask manufacturing steps. In addition, a pellicle such as a thin transparent film of nitrocellulose can be adhered to the photomask to prevent the photomask from contacting contaminants such as the dust in the surrounding air.

Figure 4:
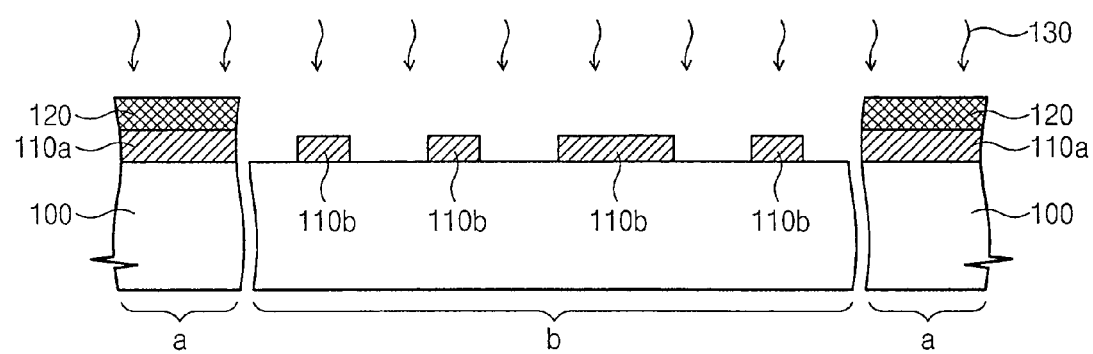
FIGS. 4 and 5 are each a cross-sectional views of a photomask, and together illustrate the method of repairing the photomask according to the present invention.

With reference to FIG. 4, the photomask of the present invention manufactured through the aforementioned procedure includes a photomask substrate 100 that is divided into a main region b and a peripheral region a. The photomask substrate 100 can be of a transparent material such as quartz. However, the material of the photomask substrate 100 will depend on the physical characteristics of the light source of the photolithography equipment in which the photomask is used.

A phase shift pattern 110b is located in the main region b of the photomask substrate 100, and exposes predetermined portions of the photomask substrate 100. Most of the peripheral region a is covered by a phase shift film 110a and a light-shielding film 120 disposed on the phase shift film 10a. As described in connection with the prior art, the phase shift pattern 110b is produced by an etching process (step S23). In this etching process, a film of phase shifting material that covers the upper surface of the substrate 100 is etched to pattern the film within the main region b and leave the remainder of the film in the peripheral region a (as the phase shift film 110a). Accordingly, as shown in FIG. 4, the thickness of the phase shift pattern 110b is identical to that of the phase shift film 110a.

The phase shift pattern 110b and the phase shift film 110a are formed of molybdenum (Mo), tantalum (Ta), zirconium (Zr), chromium (Cr), tungsten (W), or a silicide of any of these metals. Preferably, the phase shift pattern 110b and the phase shift film 110a are of molybdenum (Mo) or molybdenum silicide (MoSi). Furthermore, the light-shielding film 120 is preferably of chromium (Cr).

Returning to FIG. 3, the photomask manufactured using the aforementioned procedure (S20) is transferred to the end user, e.g., a semiconductor chip manufacturer. The end user conducts a wafer exposure process in which a photoresist film, formed on a wafer, is exposed to light directed through the photomask (step S30). The light may have a high level of energy such as that emitted from a laser. As explained above with respect to the prior art, impurities such as sulfur (S), carbon (C), ammonia ($NH_3$), nitrogen (N), and water vapor ($H_2O$) may remain in the photomask. Such impurities may be cohered by the high-energy laser used in the wafer exposure process. In this case, the photomask is repaired to remove the cohered impurities (S40).

Figure 5:
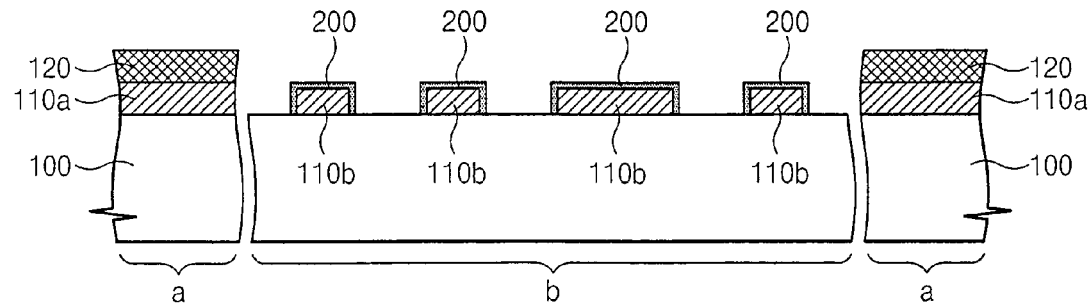

According to the present invention, the photomask repairing process (S40) includes exposing the phase shift pattern 110b (step S41), forming passivation layers 200 (FIG. 5) on surfaces of the exposed phase shift pattern 110b (step S42), and cleaning the photomask on which the passivation layers 200 are formed (step S43). The phase shift patterns are exposed (step S41) by removing a film or membrane, such as a pellicle, that encloses the photomask substrate 100.

The passivation layers 200 are formed to prevent the phase shift pattern 110b from being etched during the subsequent cleaning process (step S43). Each of the passivation layers 200 is formed of a material having an etchant selection with respect to a cleaning solution used in the cleaning process (the step S43). The passivation layers 200 comprise at least one material selected from the group consisting of molybdenum oxide, molybdenum nitride, and molybdenum silicide oxide. According to the present invention, the thickness of each of the passivation layers 200 is in a range of 3 to 100 Å. Preferably, the thickness of each of the passivation layers 200 is 3 Å.

Also, in accordance with the present invention, the passivation layers 200 are formed (step S42) by processing the photomask using plasma. More specifically, the photomask is loaded into a plasma process chamber, process gas is injected into the plasma process chamber in which the photomask is situated, and the injected process gas is converted into plasma. The plasma (130 in FIG. 4) reacts with the exposed phase shift pattern 110b to form the passivation layers 200. The composition of the passivation layers 200 is determined by the process gas. Preferably, the process gas comprises at least one gas selected from the group consisting of oxygen, ozone, and nitrogen. Process gases containing atoms of oxygen and nitrogen can be used as well.

Figure 7:
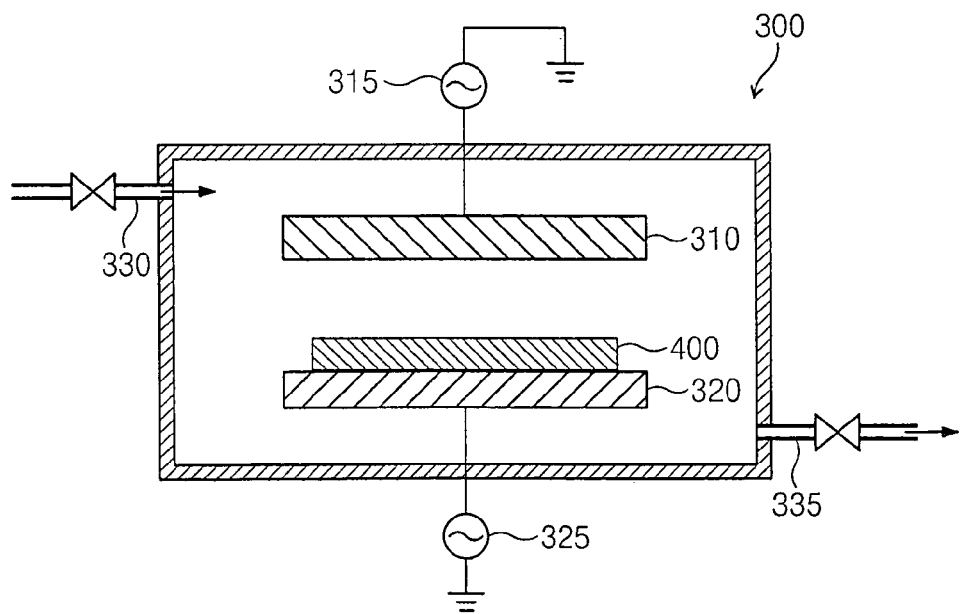
FIG. 7 is a schematic diagram of a plasma process chamber that is used in the method of repairing a photomask according to the present invention.

FIG. 7 shows a plasma processing apparatus that is used in the method of repairing a photomask according to the present invention. The apparatus includes a plasma process chamber 300 in which a plasma process is performed, and a gas supply tube 330 and a gas discharge tube 335 respectively connected to the plasma process chamber 300. Process gas is supplied into the plasma process chamber 300 through the gas supply tube 330. Some of the process gas supplied into the plasma process chamber 300 and by-products of the plasma process are discharged to the outside through the gas discharge tube 335. The plasma processing apparatus also includes a source electrode 310 for converting the process gas supplied through the gas supply tube 330 into plasma, and a bias electrode 320 for accelerating the plasma. A source power supply 315 is connected to the source electrode 310, and a bias power supply 325 is connected to the bias electrode 320. The photomask with the exposed phase shift pattern 110b can be loaded onto the bias electrode 320 within the process chamber 300.

The plasma processing apparatus may be ICP equipment such as model VLR manufactured by Unaxis Corporation of Pfäffikon, Switzerland or the Tetra model manufactured by Applied Materials Corporation of Santa Clara, Calif. In a preferred embodiment of the present invention, a temperature of 10 to 100° C. is maintained within the plasma process chamber 300 during the forming of the passivation layers 200. Such a temperature range ensures that the passivation layers 200 are formed without eliminating a carbon film from the photomask. Such a carbon film is formed using a focused ion beam (FIB) to repair pattern defects which occurred during the photomask fabrication. That is, the carbon film can be eliminated at a high temperature of ~100° C. Accordingly, only 200 to 600 Watts of power is applied to the source electrode 310.

In addition, the phase shift pattern 110b will be etched if the ions of the plasma have a certain level of energy. Preferably, therefore, only 1 to 30 Watts of power is applied to the bias electrode 320 to minimize the etching of the passivation layers 200 by the ions of the plasma. Further, a higher temperature induces a thermal stress on the phase shift films 110a, the phase shift pattern 100b, and the light-shielding film 120.

The cleaning process (step S43) comprises rinsing the photomask with an ammonia solution of about 500 ppm for 540 seconds. The results shown in FIG. 6 indicate technical effects obtained by forming the passivation layers 200 of the present invention. In particular, FIG. 6 is a graph showing the relationship between the transmittance of a photomask, having the passivation layers 200 formed thereon, and the number of times the photomask is cleaned (step S43) according to the present invention.

Figure 1:
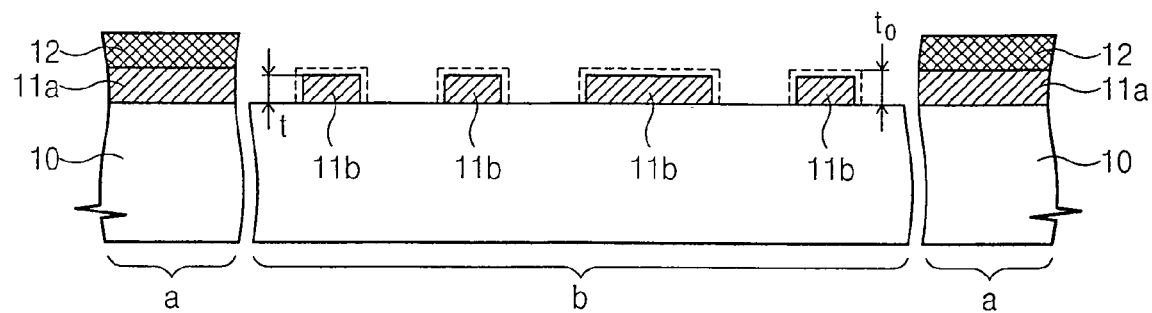
FIG. 1 is a cross-sectional view of a conventional photomask, illustrating a problem that occurs when the mask is cleaned/repaired.
Figure 2:
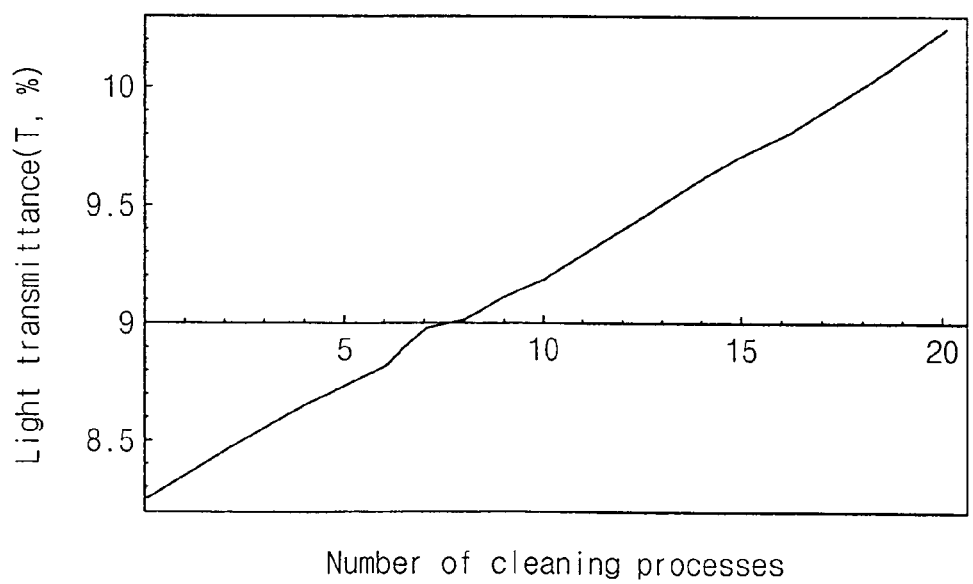
FIG. 2 is a graph showing the relation between the number of times the conventional photomask is cleaned and the resulting transmittance of the photomask.
Figure 6:
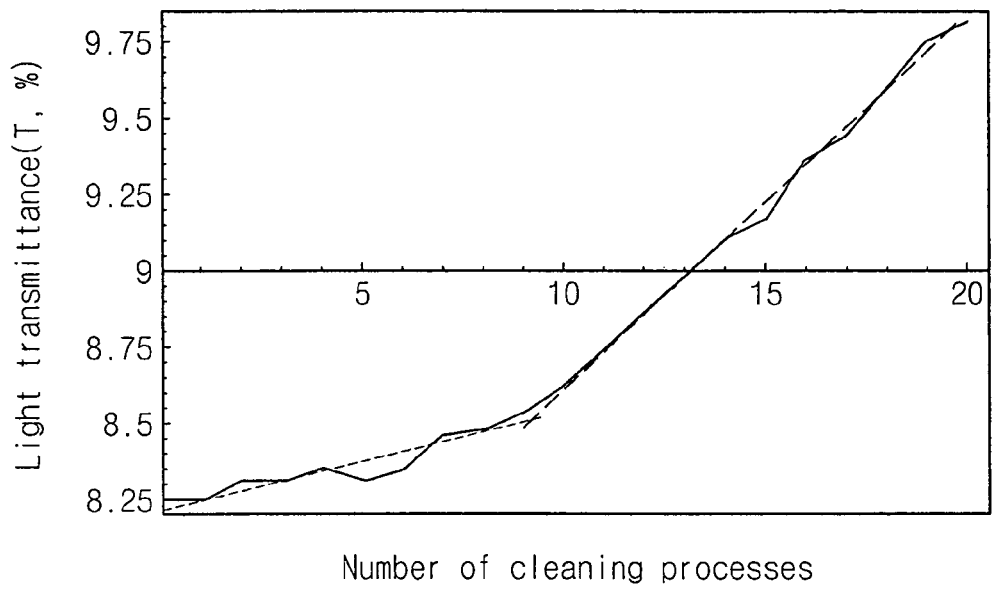
FIG. 6 is a graph showing the relation between the number of times a photomask is cleaned and the resulting transmittance of the photomask when the method according to the present invention is practiced.

Referring to FIG. 6, the light transmittance T of the phase shift pattern 110b increases at a rate of 0.03% each time the cleaning process (S43) is carried out for the first 9 times the photomask is cleaned. However, after the photomask has been cleaned 9 times, the light transmittance T of the phase shift pattern 110b increases at a rate of 0.1% for each cleaning process. The slope (0.1%) of this portion of the curve is identical to that obtained from a similar experiment conducted with the conventional photomask and cleaning process (FIG. 2). The experimental results make it clear that the passivation layers 200 are etched little by little by the cleaning processes and are entirely removed only once the photomask has been cleaned 9 times, after which the etching rate becomes similar to that which occurs in the conventional process.

It is thus clear from these experimental results that the method of repairing a photomask according to the present invention is effective in preventing the thickness of the phase shift pattern 110b from being reduced. According to the present invention, a phase shift pattern 110b having a transmittance of 8% at the time the photomask is first manufactured can be subjected to 33 cleaning processes (S43) before the transmittance T of the phase shift pattern 110b reaches the limit transmittance Tc of 9% referred to in the description of the prior art. Accordingly, useful life of the photomask can be extended by practicing the present invention and hence, the costs associated with manufacturing the semiconductor devices can be decreased.

Moreover, the expected life of 33 cleaning processes is based on the results in which the passivation layers were formed only prior to the first cleaning process (step S43). However, in accordance with an embodiment of the present invention, the passivation layer forming step (step S42) may be performed after each cleaning process (step S43) or after predetermined intervals. Therefore, the life of the photomask can be significantly extended even further.

In any case, the transmittance T of the photomask is measured after each cleaning process (S43) and a determination is made (S50) as to whether to continue using the photomask. If the transmittance T is below the limit transmittance Tc allowed for by the exposure process (S30), then the photomask is used for another exposure process. On the other hand, if the transmittance T is above the limit transmittance Tc, then the photomask is discarded (step S60).

According to the present invention as described above, passivation layers are selectively formed on only exposed surfaces of phase shift pattern before the photomask is cleaned. The passivation layers protect the phase shift pattern against being etched during the cleaning process. As a result, the useful life of the photomask—a high-priced element—is prolonged. Accordingly, the manufacturing cost of semiconductor devices is reduced.

Also, the passivation layers are formed only exposed surfaces of the phase shift pattern, namely, on respective sidewalls and upper surfaces of the phase shift pattern. That is, the passivation layers do not shield the upper surface of the photomask substrate that is exposed by the phase shift pattern. Accordingly, the present invention is also advantageous in that it does not require any changes to the conditions under which the wafer exposure process is carried out.

Finally, although the present invention has been described in connection with the preferred embodiments thereof, the present invention is not so limited. Rather, various modifications and changes may be made to the preferred embodiments, as will be apparent to those of ordinary skill in the art, without departing from the true scope and spirit of the invention as defined by the appended claims.

What is claimed is:

1. A method of repairing a phase shift mask having a substrate and a phase shift pattern on the substrate, the method comprising:
   readying a phase shift mask which has been used in an exposure process of photolithography, wherein the phase shift mask has a substrate and a phase shift pattern on the substrate, and the exposure process has transmitted an image corresponding to the pattern of the mask by directing light through the phase shift mask;
   subsequently passivating exposed surfaces of the phase shift pattern by treating the exposed surfaces of the phase shift pattern using plasma, to thereby form passivation layers on the surfaces; and
   subsequently cleaning the phase shift pattern of the phase shift mask to remove defects in the phase shift pattern created by the light directed through the phase shift mask during the exposure process.

2. The method as set forth in claim 1, wherein said passivating comprises forming the passivation layers so as to have a thickness of 3 to 100 Å.

3. The method as set forth in claim 1, wherein said passivating comprises:
   loading the phase shift mask into a plasma process chamber,
   injecting a process gas into the plasma process chamber,
   converting the injected process gas into a plasma, and
   treating the exposed surfaces of the phase shift patterns with the plasma.

4. The method as set forth in claim 3, wherein the process gas includes atoms of at least one gas selected from the group consisting of oxygen, ozone, and nitrogen.

5. The method as set forth in claim 3, wherein said converting of the injected process gas into a plasma comprises delivering 200 to 600 Watts of power to the plasma process chamber.

6. The method as set forth in claim 3, wherein said converting of the injected process gas into a plasma comprises generating a bias power of 1 to 30 Watts within the plasma process chamber.

7. The method as set forth in claim 3, and further comprising maintaining a temperature of 10 to 100° C. within the plasma process chamber while the exposed surfaces of the phase shift pattern are being passivated.

8. The method as set forth in claim 1, wherein said cleaning of the phase shift mask comprises rinsing the mask with a solution having an etch selectivity with respect the passivation layers and the material of the phase shift pattern.

9. The method as set forth in claim 8, wherein the solution is a solution of ammonia.

10. A method of photolithography, comprising:
    providing a phase shift mask having a substrate and a phase shift pattern on the substrate;
    performing an exposure process in which a layer of photoresist is irradiated with exposure light of a given wavelength directed through the phase shift mask;
    subsequently passivating exposed surfaces of the phase shift pattern to thereby form passivation layers on the surfaces;
    subsequently cleaning the phase shift pattern of the phase shift mask to remove defects in the phase shift pattern created by the light directed through the phase shift mask during the exposure process; and
    subsequently performing another exposure process in which a layer of photoresist is irradiated with exposure light of the given wavelength directed through the phase shift mask.

11. The method as set forth in claim 10, and further comprising determining whether the transmittance of the phase shift mask, with respect to the exposure light, is greater than a threshold value after said cleaning of the photomask is carried out.

12. The method as set forth in claim 10, wherein the phase shift mask is enclosed in a pellicle, and further comprising removing the pellicle to expose surfaces of the phase shift pattern before the phase shift pattern is passivated.

13. The method as set forth in claim 10, wherein said passivating comprises:
    treating the exposed surfaces of the phase shift pattern using plasma.

14. The method as set forth in claim 10, wherein said cleaning of the phase shift mask comprises rinsing the mask with a solution having an etch selectivity with respect the passivation layers and the material of the phase shift pattern.

15. The method as set forth in claim 14, wherein the solution is a solution of ammonia.

16. The method as set forth in claim 13, wherein said passivating comprises:
    loading the phase shift mask into a plasma process chamber,
    injecting a process gas into the plasma process chamber,
    converting the injected process gas into a plasma, and
    treating the exposed surfaces of the phase shift pattern using the plasma.

17. The method as set forth in claim 13, wherein the process gas includes atoms of at least one gas selected from the group consisting of oxygen, ozone, and nitrogen.

18. The method as set forth in claim 10, wherein the phase shift mask is enclosed in a pellicle, and the readying of the phase shift mask comprises removing the pellicle to expose surfaces of the phase shift pattern.

* * * * *